(12) United States Patent
Wang et al.

(10) Patent No.: US 11,189,641 B2
(45) Date of Patent: Nov. 30, 2021

(54) METHOD FOR MANUFACTURING ARRAY SUBSTRATE, ARRAY SUBSTRATE AND DISPLAY APPARATUS

(71) Applicants: BOE Technology Group Co., Ltd., Beijing (CN); Beijing BOE Display Technology Co., Ltd., Beijing (CN)

(72) Inventors: Shoukun Wang, Beijing (CN); Huibin Guo, Beijing (CN); Hao Han, Beijing (CN); Fangbin Fu, Beijing (CN); Yongzhi Song, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/028,017

(22) Filed: Jul. 5, 2018

(65) Prior Publication Data

US 2019/0103419 A1    Apr. 4, 2019

(30) Foreign Application Priority Data

Sep. 29, 2017  (CN) .......................... 201710908171.8

(51) Int. Cl.
*H01L 27/12*    (2006.01)
*G02F 1/1368*   (2006.01)
(Continued)

(52) U.S. Cl.
CPC ........ *H01L 27/1218* (2013.01); *G02F 1/1368* (2013.01); *H01L 27/124* (2013.01);
(Continued)

(58) Field of Classification Search
CPC ............. H01L 27/1218; H01L 27/1225; H01L 27/124; H01L 27/1262; H01L 27/127;
(Continued)

(56) References Cited

U.S. PATENT DOCUMENTS 6,081,310 A     6/2000   Katsuya et al.
2005/0231670 A1*  10/2005  Hashiguchi ....... G02F 1/133555
                                             349/138
(Continued)

FOREIGN PATENT DOCUMENTS

GN       1930639 A    3/2007

OTHER PUBLICATIONS

Office Action dated Jul. 19, 2019 issued in corresponding Chinese Application No. 201710908171.8.

*Primary Examiner* — Shih Tsun A Chou
(74) *Attorney, Agent, or Firm* — Nath, Goldberg & Meyer; Joshua B. Goldberg

(57) ABSTRACT

An array substrate, a manufacturing method thereof, and a display apparatus are provided. The array substrate includes a display area and a non-display area in the periphery of the display area, the display area includes pixel regions, the display and non-display areas are provided with via holes, wherein each pixel region is provided, at a side facing a display side, with a reflection layer configured to reflect light irradiated thereon from an external light source to form a display image; and an anti-deterioration layer in contact with the reflection layer is provided in the via holes in the display and non-display areas. Thus, by using a new material, utilization of external light source is improved without additional masking process, and connection in via holes in the display area, and especially in the non-display area is achieved, which prevents deterioration of the via holes and poor contact resistance.

13 Claims, 5 Drawing Sheets

(51) Int. Cl.
  *H01L 29/786*  (2006.01)
  *G02F 1/1335*  (2006.01)
  *G02F 1/1362*  (2006.01)

(52) U.S. Cl.
  CPC ........ *H01L 27/127* (2013.01); *H01L 27/1225* (2013.01); *H01L 27/1259* (2013.01); *H01L 27/1262* (2013.01); *H01L 27/1288* (2013.01); *H01L 29/78633* (2013.01); *G02F 1/133553* (2013.01); *G02F 1/133618* (2021.01); *G02F 1/136227* (2013.01); *G02F 2203/02* (2013.01)

(58) Field of Classification Search
  CPC ........... H01L 27/1288; G02F 1/136227; G02F 1/133553; G02F 1/133555; G02F 1/1333; G02F 1/1368; G02F 1/136231; G02F 1/1352; G02F 1/133504
  See application file for complete search history.

(56) References Cited

U.S. PATENT DOCUMENTS

| | | | |
|---|---|---|---|
| 2007/0146592 A1* | 6/2007 | Kimura | G02F 1/133555 349/114 |
| 2008/0286889 A1* | 11/2008 | Chang | G03F 7/0007 438/30 |
| 2017/0207325 A1* | 7/2017 | Lin | H01L 21/477 |

* cited by examiner

METHOD FOR MANUFACTURING ARRAY SUBSTRATE, ARRAY SUBSTRATE AND DISPLAY APPARATUS

CROSS-REFERENCE TO RELATED APPLICATION

This application claims the benefit of priority to Chinese Patent Application No. 201710908171.8 filed on Sep. 29, 2017, the contents of which are incorporated herein in their entirety by reference.

TECHNICAL FIELD

The present disclosure relates to the field of display technology, and particularly relates to a method for manufacturing an array substrate, an array substrate and a display apparatus.

BACKGROUND

Liquid crystal displays are commonly used flat panel display apparatuses. For a liquid crystal display panel, since liquid crystal itself does not emit light, an extra light source is required to achieve display. Most of the current display panels adopt a backlight source as a light source to achieve display, which inevitably increases the volume and power consumption of display products.

SUMMARY

In view of the disadvantages in the related art, the present disclosure provides a method for manufacturing an array substrate, an array substrate, and a display apparatus, which can not only achieve complete reflection display using an external light source but also ensure the quality of via holes in the non-display area of the array substrate and thus improve display quality.

In one aspect, the present disclosure provides an array substrate including a display area and a non-display area in the periphery of the display area, the display area includes a plurality of pixel regions, the display area and the non-display area are both provided with via holes, wherein each of the plurality of pixel regions is provided with a reflection layer at a side facing a display side, the reflection layer is configured to reflect light irradiated thereon from an external light source to form a display image; and an anti-deterioration layer is provided in the via holes in the display area and the non-display area, and the anti-deterioration layer is in contact with the reflection layer.

In an embodiment, in the display area, the anti-deterioration layer and the reflection layer have substantially the same pattern.

In an embodiment, the anti-deterioration layer is made of any one or any combination of molybdenum, niobium, and molybdenum titanium alloy.

In an embodiment, the reflection layer is made of any one or any combination of aluminum, silver, and aluminum neodymium alloy.

In an embodiment, each of the pixel regions is provided with a substrate and a thin film transistor, the thin film transistor is on the substrate, and the anti-deterioration layer is on a side of the thin film transistor distal to the substrate, the reflection layer is on a side of the anti-deterioration layer distal to the thin film transistor, and the reflection layer and the anti-deterioration layer are coupled to a drain electrode of the thin film transistor.

In an embodiment, the array substrate further includes a transparent electrode layer coupled to the anti-deterioration layer and the reflection layer, and the transparent electrode layer is on a side of the anti-deterioration layer close to the thin film transistor.

In an embodiment, the transparent electrode layer is further provided in the via holes of the display area and the non-display area.

In another aspect, there is provided a method for manufacturing an array substrate, the array substrate includes a display area and a non-display area in the periphery of the display area, the display area includes a plurality of pixel regions, the display area and the non-display area are both provided with via holes, wherein the manufacturing method includes: forming, in the pixel regions, a reflection layer configured to reflect light irradiated thereon from an external light source of the array substrate to form a display image; and forming an anti-deterioration layer in the via holes in the display area and the non-display area, the anti-deterioration layer being in contact with the reflection layer.

In an embodiment, the anti-deterioration layer and the reflection layer are formed by one patterning process, wherein in the display area, the anti-deterioration layer and the reflection layer have substantially the same pattern.

In an embodiment, each of the pixel regions further includes a substrate and a thin film transistor, and the manufacturing method includes: forming the thin film transistor on the substrate, wherein the anti-deterioration layer is provided on a side of the thin film transistor distal to the substrate, the reflection layer is provided on a side of the anti-deterioration layer distal to the thin film transistor, and the reflection layer and the anti-deterioration layer are coupled to a drain electrode of the thin film transistor.

In an embodiment, forming the anti-deterioration layer and the reflection layer by one patterning process includes: sequentially depositing an anti-deterioration material layer and a reflection material layer, and performing one patterning process on the anti-deterioration material layer and the reflection material layer using a half tone mask or a gray tone mask to form a pattern including the anti-deterioration layer and the reflection layer, wherein blocking areas of the half tone mask or the gray tone mask correspond to the pixel regions and the via holes in the display area, half-exposing areas of the half tone mask or the gray tone mask correspond to the via holes in the non-display area, and fully-exposing areas of the half tone mask or the gray tone mask correspond to other areas.

In an embodiment, each of the pixel regions further includes a substrate, a thin film transistor and a transparent electrode layer. The manufacturing method includes: forming the thin film transistor on the substrate; forming the transparent electrode layer, the anti-deterioration layer and the reflection layer on a side of the thin film transistor distal to the substrate in one patterning process, wherein the transparent electrode layer is provided on a side of the thin film transistor distal to the substrate, the anti-deterioration layer is provided on a side of the transparent electrode layer distal to the thin film transistor, the reflection layer is provided on a side of the anti-deterioration layer distal to the transparent electrode layer, and the transparent electrode layer, the reflection layer and the anti-deterioration layer are coupled to a drain electrode of the thin film transistor.

In an embodiment, forming the transparent electrode layer, the anti-deterioration layer and the reflection layer in one patterning process includes: sequentially depositing a transparent electrode material layer, an anti-deterioration material layer, and a reflection material layer, and performing one patterning process on the transparent electrode material layer, the anti-deterioration material layer and the reflection material layer using a half tone mask or a gray tone mask to form a pattern including the transparent electrode layer, the anti-deterioration layer and the reflection layer, wherein blocking areas of the half tone mask or the gray tone mask correspond to the pixel regions and the via holes in the display area, half-exposing areas of the half tone mask or the gray tone mask correspond to the via holes in the non-display area, and fully-exposing areas of the half tone mask or the gray tone mask correspond to other areas.

In still another aspect, there is provided a display apparatus including the array substrate as described above.

The present disclosure can achieve the beneficial effects as follows: in the array substrate and the manufacturing method thereof, by using a new material, the utilization ratio of an external light source can be improved without additional masking process, thereby achieving complete reflection display using the external light source, and in addition, connection in via holes in the display area, and especially in the non-display area is achieved, which prevents deterioration of the via holes and poor contact resistance, thereby improving product yield, and improving display quality.

DETAILED DESCRIPTION

To enable those skilled in the art to better understand technical solutions of the present disclosure, a method for manufacturing an array substrate, an array substrate, and a display apparatus of the present disclosure will be described in detail below with reference to the accompanying drawings and specific embodiments.

In the present disclosure, a photolithography process refers to a process of forming a pattern by etching using a photoresist, a mask, an exposure machine, and the like and includes processes of exposing, developing, etching, etc.; a patterning process includes the photolithography process, and other processes for forming a predetermined pattern such as printing, inkjet printing, and the like.

A liquid crystal display panel generally uses a thin film transistor (TFT) to control light emission, and a via hole generally needs to be formed to couple a drain electrode of the thin film transistor to a pixel electrode or the like. In addition, a via hole also needs to be formed in the non-display area to achieve connection to an external drive terminal. A current pixel electrode is generally made of a transparent material such as indium tin oxide (ITO), and the ITO material is also filled in the via hole in the non-display area. However, in an environment of high temperature and high humidity, the ITO material is prone to electrochemical corrosion, resulting in deterioration and large contact resistance, which leads to abnormal signal transmission in the via hole and degrades display quality.

Accordingly, embodiments of the present disclosure provide a Omni Directional Reflector (ODR) display panel, which can not only increase reflectivity, but also solve the problem of deteriorated via hole and increased contact resistance in the non-display area of the existing display panel, and thus has improved display quality.

An array substrate provided by an embodiment of the present disclosure includes a display area 21 and a non-display area 22 in the periphery of the display area 21. The display area 21 includes a plurality of pixel regions. The display area 21 and the non-display area 22 each are provided with via holes, and a reflection layer 10 is provided in each pixel region of the array substrate at a side facing a display side, and configured to reflect light irradiated thereon from an external light source to form a display image. An anti-deterioration layer 9 is provided in the via holes of both the display area 21 and the non-display area 22, and the anti-deterioration layer 9 is in contact with the reflection layer 10. In order not to affect the reflection layer 10, the anti-deterioration layer 9 is farther away from the external light source than the reflection layer 10.

Figure 1:
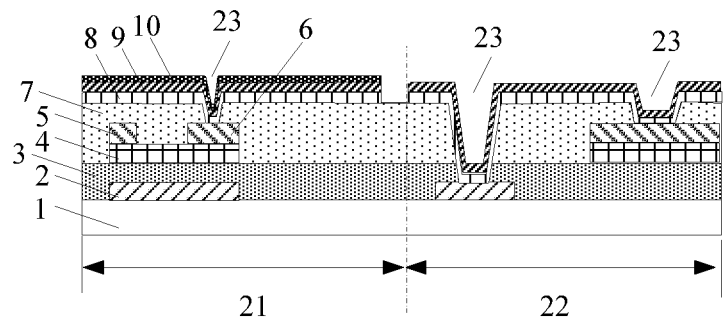
FIG. 1 is a schematic structural diagram of an array substrate in an embodiment of the present disclosure.

In an embodiment, as shown in FIG. 1, the array substrate includes a substrate 1, a thin film transistor (TFT) on the substrate 1, an anti-deterioration layer 9 on a side of the TFT distal to the substrate 1, and a reflection layer 10 directly on a surface of the anti-deterioration layer 9 distal to the TFT (i.e., the reflection layer 10 is on a side of the pixel region facing the display side, the anti-deterioration layer 9 is in contact with the reflection layer 10 and is farther away from the external light source than the reflection layer 10). The TFT may include a gate electrode 2 on the substrate 1, a gate insulating layer 3 on a side of the gate electrode 2 distal to the substrate 1, an active layer 4 on a side of the gate insulating layer 3 distal to the gate electrode 2, and a source electrode 5 and a drain electrode 6 on a side of the active layer 4 distal to the gate insulating layer 3. The array substrate may further include a transparent electrode layer 8 coupled to the reflection layer 10 and the anti-deterioration layer 9 and located on a side of the anti-deterioration layer 9 distal to the reflection layer 10. In addition, a passivation layer 7 may be formed between the TFT and the anti-deterioration layer 9 (in the presence of the transparent electrode layer 8, the passivation layer 7 is formed between the TFT and the transparent electrode layer 8).

The reflection layer 10 and the anti-deterioration layer 9 are coupled to the drain electrode 6 of the TFT, and the transparent electrode layer 8 is coupled to the reflection layer 10 and the anti-deterioration layer 9, so that the transparent electrode layer 8, the reflection layer 10, and the anti-deterioration layer 9 together form a pixel electrode, which is coupled to the drain electrode 6 of the TFT. In the example shown in FIG. 1, the transparent electrode layer 8, the reflection layer 10 and the anti-deterioration layer 9 are coupled to the drain electrode 6 of the TFT through the via hole 23 on the drain electrode 6. In this case, the transparent electrode layer 8, the reflection layer 10 and the anti-deterioration layer 9 are formed in the via hole 23. In addition, in the non-display area 22, the transparent electrode layer 8 and the anti-deterioration layer 9 are also formed in the via hole 23 of the non-display area 22. It could be understood that in the absence of the transparent electrode layer 8, the reflection layer 10 and the anti-deterioration tion layer 9 are formed in the via hole 23 in the display area 21, and only the anti-deterioration layer 9 is formed in the via hole 23 in the non-display area 22, as shown in FIG. 4.

It could be understood that the reflection layer 10 is disposed towards the display side to receive light from the external light source and reflect the light from the external light source toward the display side to achieve display. In the accompanying drawings, the display side in the present disclosure is the upper side of the array substrate, and therefore, the reflection layer 10 is provided towards a direction away from the substrate 1.

Figure 6:
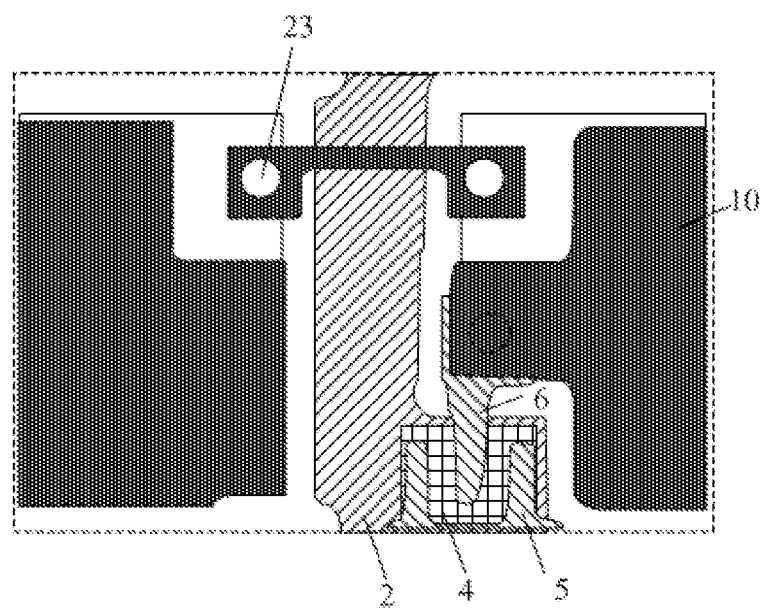
FIG. 6 is a top view illustrating via holes in a display area included in an array substrate in an embodiment of the present disclosure.

As shown in FIG. 6, the via holes 23 in the display area 21 are generally located between adjacent pixel regions (not in the pixel regions), for example, above a data line or a scan line (not specifically shown in FIGS. 1 and 6).

In the display area 21, the transparent electrode layer 8, the anti-deterioration layer 9, and the reflection layer 10 have substantially the same pattern. In an embodiment, the anti-deterioration layer 9 may be made of a metal material having good stability such as molybdenum (Mo), niobium (Nb) or molybdenum titanium alloy (MoTi). The reflection layer 10 may be made of a metal material having a high reflectivity such as aluminum (Al), silver (Ag), or aluminum neodymium alloy (AlNd).

In the array substrate provided by the embodiment, the reflection layer 10 is disposed in each pixel region of the display area at a side towards the display side, therefore, the reflectivity is greatly increased, the display can be realized without a backlight source, as a result, the backlight source can be omitted, and ODR display can be achieved in the absence of a backlight source. Needless to say, in the presence of a backlight source, the utilization ratio of an external light source can be improved through the reflection layer 10, so as to achieve a transflective display. In via holes in the non-display area, connection is implemented through ITO and Mo, so as to achieve better contact in the via holes. Because the non-display area in the periphery is in contact with the air, the design of ITO plus Mo can prevent corrosion more effectively.

In another aspect, an embodiment of the present disclosure provides a method for manufacturing an array substrate. The array substrate includes a display area 21 and a non-display area 22 in the periphery of the display area 21. The display area 21 includes a plurality of pixel regions, and the display area 21 and the non-display area 22 both are provided therein with via holes. Each pixel region is provided with a reflection layer 10 on a side towards the display side, and the reflection layer 10 is configured to reflect light irradiated thereon from an external light source to form a display image. An anti-deterioration layer 9 is formed in the via holes in both the display area 21 and the non-display area 22, and the anti-deterioration layer 9 is in contact with the reflection layer 10 and is farther away from the external light source than the reflection layer 10.

In the display area 21, the anti-deterioration layer 9 and the reflection layer 10 may have substantially the same pattern and may be formed in one patterning process.

In an embodiment, the anti-deterioration layer 9 and the reflection layer 10 are formed using a half tone mask or a gray tone mask, areas of the mask corresponding to the pixel regions and the via holes in the display area 21 are blocking areas, areas of the mask corresponding to the via holes in the non-display area 22 are half-exposing areas, and the other areas of the mask are fully-exposing areas.

In a case where each pixel region of the array substrate includes a TFT as a control element, a thin film transistor is first formed by a patterning process, and then a pattern including at least the anti-deterioration layer 9 and the reflection layer 10 is formed above the thin film transistor by a patterning process (the anti-deterioration layer 9 is closer to the TFT than the reflection layer 10), and the reflection layer 10 and the anti-deterioration layer 9 are coupled to a drain electrode of the thin film transistor to control liquid crystal in the corresponding pixel region. The array substrate may further include a transparent electrode layer 8 coupled to the reflection layer 10 and the anti-deterioration layer 9, and the transparent electrode layer 8 is located on a side of the anti-deterioration layer 9 distal to the reflection layer 10. In addition, a passivation layer 7 may be formed between the TFT and the anti-deterioration layer 9 (in the presence of the transparent electrode layer 8, the passivation layer 7 is formed between the TFT and the transparent electrode layer 8).

In an embodiment, a manufacturing process of an array substrate specifically includes steps S11 to S18.

Figure 2A:
FIGS. 2A to 2H illustrate a manufacturing process of an array substrate in an embodiment of the present disclosure.

In step S11, a gate material layer is deposited on a substrate 1 (i.e., gate deposition is performed), and the gate material layer is exposed and etched using a normal mask to form a pattern including a gate electrode 2 (i.e., gate etching is performed), as shown in FIG. 2A.

Figure 2B:
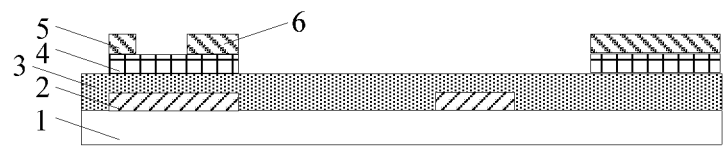

In step S12, a gate insulating layer 3 is formed on a side of the gate electrode 2 distal to the substrate 1, and an active material layer and a source/drain electrode material layer are deposited on a side of the gate insulating layer 3 distal to the gate electrode 2 (i.e., active deposition and SD deposition are sequentially performed), the active material layer and the source/drain electrode material layer are exposed and etched using a half tone mask or a gray tone mask to form a pattern including a source electrode 5 and a drain electrode 6, a pattern including an active layer 4, and a trench, which forms a channel during turning-on of the TFT, between the source electrode 5 and the drain electrode 6, as shown in FIG. 2B.

Figure 2C:
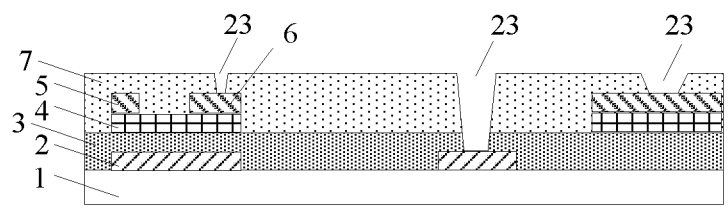

At this point, the preparation of the thin film transistor is completed. In step S13, a passivation layer 7 is deposited on a side of the source electrode 5 and the drain electrode 6 distal to the active layer 4 (i.e., PVX deposition is performed), and the passivation layer 7 is patterned using a normal mask to form via holes in the display area 21 and the non-display area 22 in the periphery. In an embodiment, the via holes 23 over a scan line and a common electrode line are formed by etching two layers, namely, the gate insulating layer 3 and the passivation layer 7, and are deep holes. The via holes 23 above a data line and the drain electrode 6 are formed by etching only the passivation layer 7, and are shallow holes. The deep holes and the shallow holes exist in both the display area 21 and the non-display area 22 in the periphery, as shown in FIG. 2C.

Figure 2D:
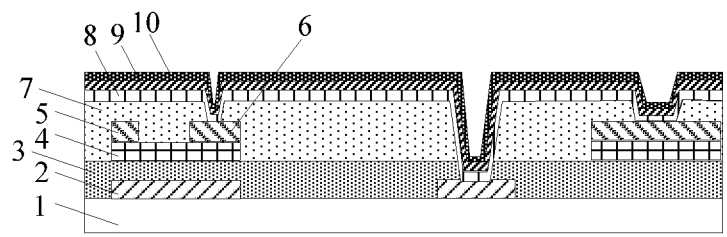

In step S14, a transparent electrode material layer (e.g., ITO material layer), an anti-deterioration metal layer (e.g., Mo layer), and a reflective metal layer (e.g., Al layer) are sequentially deposited on a side of the passivation layer distal to the source electrode 5 and the drain electrode 6, as shown in FIG. 2D. It should be noted that the transparent electrode material layer, the anti-deterioration metal layer, and the reflective metal layer are also formed in the via holes 23 during the deposition.

Figure 2E:
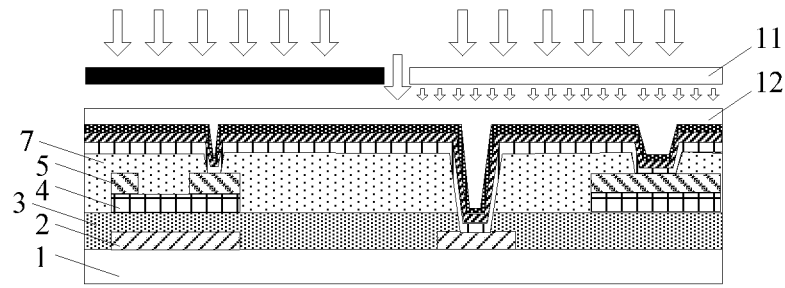

In step S15, a photoresist layer 12 is formed on a side of the reflective metal layer (e.g., Al layer) distal to the passivation layer, and an exposure process is performed on the transparent electrode material layer, the anti-deterioration metal layer and the reflective metal layer using a gray tone or half tone mask 11. During the exposure process, blocking areas of the gray tone or half tone mask 11 correspond to the pixel regions and areas of the via holes in the display area 21, half-exposing areas correspond to areas of the via holes in the non-display area 22, and fully-exposing areas correspond to other areas. In this way, the areas of the non-display area 22 in the periphery corresponding to the via holes are half-exposed and the other areas are normally exposed, as shown in FIG. 2E.

Figure 2F:
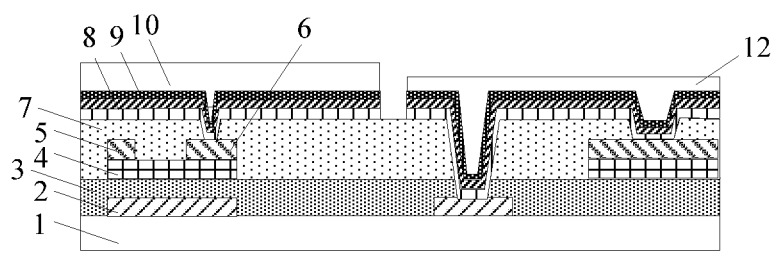

In step S16, parts of the anti-deterioration metal layer and the reflective metal layer in the fully-exposing areas are etched off through an etching process, and the photoresist 12 in the half-exposing areas and the blocking areas is not fully exposed and still remains to shield corresponding parts of the anti-deterioration metal layer and the reflective metal layer; then, an ashing process is performed on the photoresist 12 by way of dry etching, and parameters are controlled (for example, in the case of using a combination of $SF_6$ gas and $O_2$ gas as an etching gas, ashing time and ashing gas flow rate are controlled) such that the photoresist in the half-exposing areas is completely ashed, and an appropriate amount of photoresist in the blocking area remains, as shown in FIG. 2F.

Figure 2G:
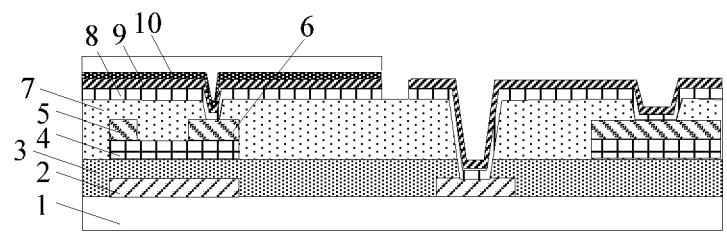

In step S17, a wet etching process is performed, and etching time is controlled (e.g., the etching time may be slightly longer than the time required for etching off the reflective metal layer, so as to ensure that the reflective metal layer is completely etched off) such that the reflective metal layer in the half-exposing areas is etched off, and the ITO material and Mo material remain, thereby forming a pattern including the transparent electrode layer 8, the anti-deterioration layer 9, and the reflection layer 10, as shown in FIG. 2G.

Figure 2H:
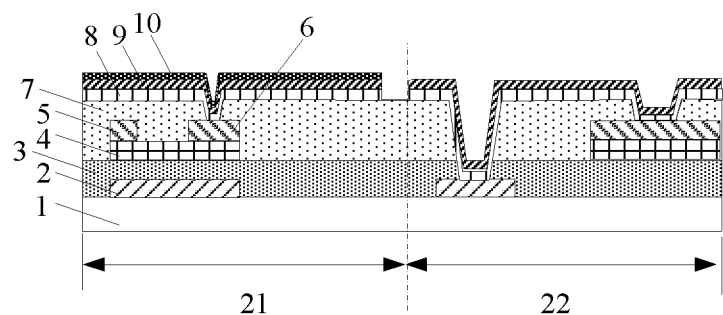

In step S18, all the remaining photoresist 12 is stripped off, thereby forming an array substrate as shown in FIG. 2H.

For an array substrate formed by the method, in the display area, a reflection layer is used to implement reflection of light from a light source, and via holes are sealed after assembly to be isolated from the air; in the non-display area, connection in the areas of the via holes is implemented through ITO and Mo, so as to achieve better contact in the via holes; further, because the non-display area in the periphery is in contact with the air, the design of ITO plus Mo can prevent corrosion more effectively. In addition, as the reflection layer 10 is disposed in each pixel region in the display area at a side towards the display side, the reflectivity is greatly increased, the display can be realized without a backlight source, as a result, the backlight source can be omitted, and ODR display can be achieved in the absence of a backlight source. Needless to say, in the presence of a backlight source, the utilization ratio of an external light source can be improved through the reflection layer 10, so as to achieve a transflective display.

In the array substrate and a corresponding manufacturing method thereof in the embodiments, by adopting a combination of materials of Mo and Al, which is different from the material adopted in the related art, on the one hand, the reflectivity as well as the utilization ratio of an external light source can be increased; on the other hand, oxidation of the material Al filling in the via holes in the non-display area and poor contact due to deterioration of the ITO in the via holes can be avoided without additional process steps.

Figure 3:
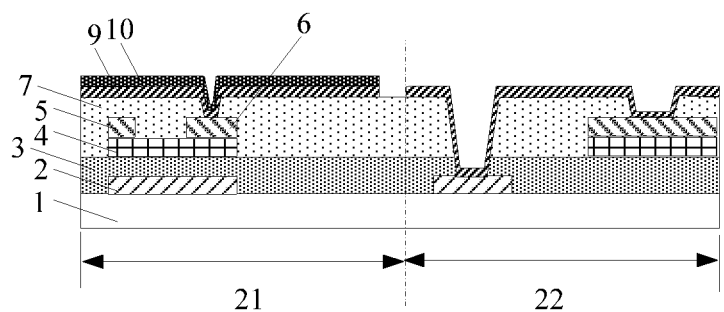
FIG. 3 is a schematic structural diagram of an array substrate in an embodiment of the present disclosure.

In an embodiment, the array substrate may not include the transparent electrode layer 8. In this case, as shown in FIG. 3, a step of forming the transparent electrode layer using ITO material is omitted, and only the reflection layer and the anti-deterioration layer form a pixel electrode, which is coupled to a drain electrode of the thin film transistor.

Figure 4A:
FIGS. 4A-4H illustrate a manufacturing process of an array substrate in an embodiment of the present disclosure.
Figure 4B:
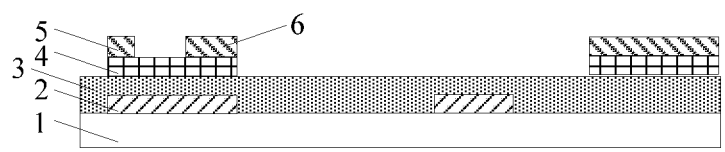
Figure 4C:
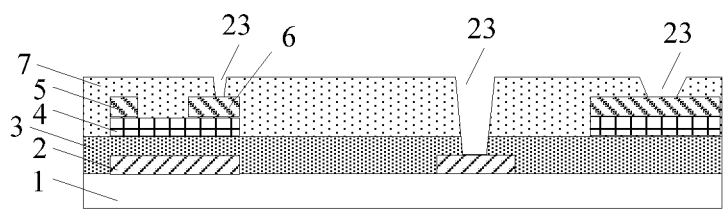

Referring to FIGS. 4A to 4H, the steps shown in FIGS. 4A to 4C may refer to the description of FIGS. 2A to 2C. The manufacturing method of the array substrate as shown in FIG. 3 differs from the manufacturing method of the array substrate as shown in FIG. 1 in step 14.

Figure 4D:
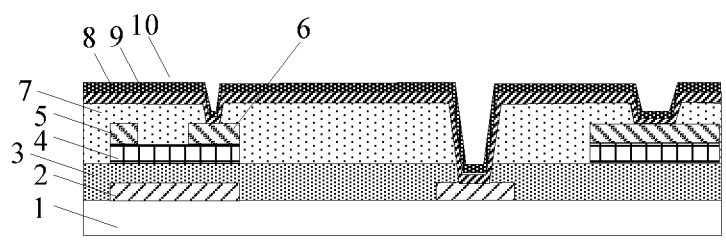
Figure 4E:
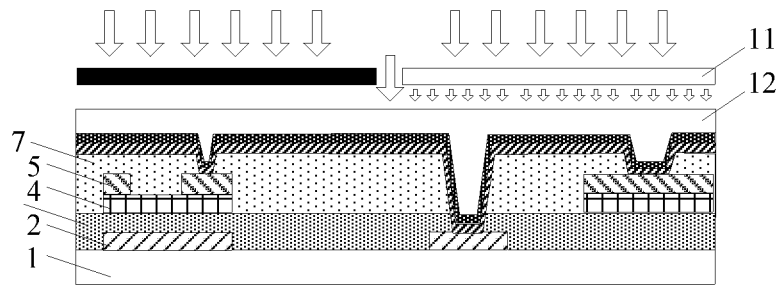
Figure 4F:
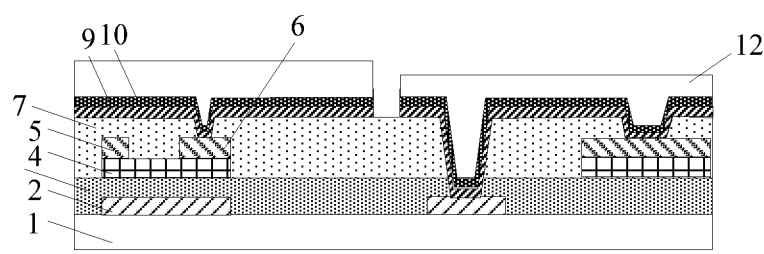
Figure 4G:
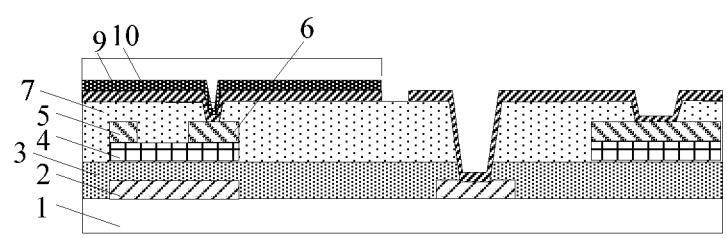
Figure 4H:
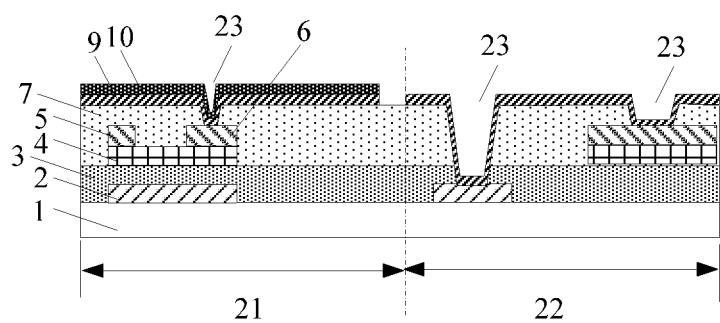

After step S13 of depositing the passivation layer 7 on the side of the source electrode 5 and the drain electrode 6 distal to the active layer 4, and forming the via holes 23 above gate electrodes and data lines in the display area 21 and the non-display area 22 in the periphery (e.g., through a via hole forming process), step S14 includes: sequentially depositing an anti-deterioration metal layer (e.g., Mo layer) and a reflective metal layer (e.g., Al layer), as shown in FIG. 4D, and the step of depositing ITO material layer as a pixel electrode in the prior art is omitted. It should be noted that during the deposition, the anti-deterioration metal layer and the reflective metal layer are also formed in the via holes 23 formed in step S13. Accordingly, a patterning process performed on the ITO material layer is omitted in the subsequent steps. The other structures and their preparation processes are the same as the corresponding structures and processes in the above-described method for manufacturing the array substrate shown in FIG. 1, and will not be described in detail herein.

In the array substrate provided in the present disclosure and the array substrate manufactured using the above manufacturing method, by using a new material, the utilization ratio of an external light source can be improved without additional masking process, and in addition, connection in via holes in the display area, and especially in the non-display area is achieved, which prevents the deterioration of the via holes and poor contact resistance, thereby improving product yield.

An embodiment of the present disclosure provides a display apparatus. The display apparatus includes any one of the array substrates described above, and a color filter substrate disposed opposite to the array substrate, and liquid crystal 32 is disposed between the color filter substrate and the array substrate.

Figure 5:
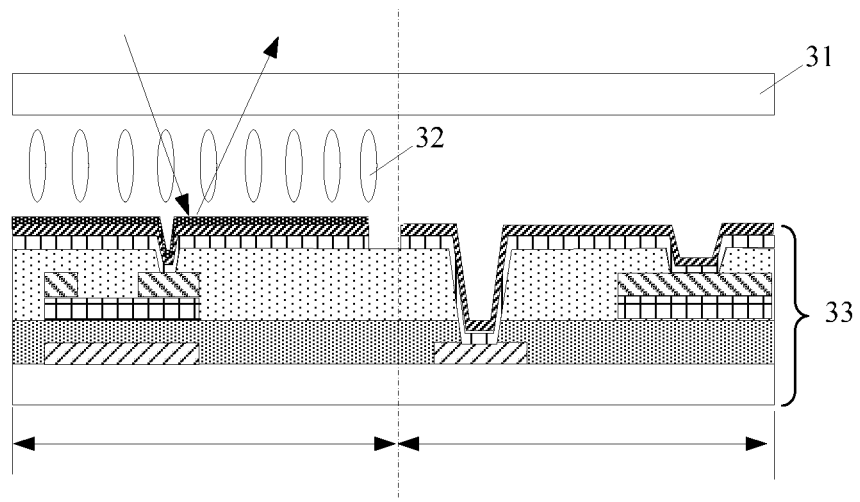
FIG. 5 is a schematic structural diagram of a display apparatus in an embodiment of the present disclosure.

As shown in FIG. 5, each pixel region of the array substrate is provided with a reflection layer 10 at a side facing the display side, and the reflection layer 10 is configured to reflect light irradiated thereon from an external light source to form a display image. An anti-deterioration layer 9 is provided in the via holes in the display area 21 and the non-display area 22, and the anti-deterioration layer 9 is in contact with the reflection layer 10 and farther away from the external light source than the reflection layer 10 (i.e., the anti-deterioration layer 9 is on a surface of the reflection layer 10 distal to the liquid crystal 32).

The operating principle of the display apparatus is that light from an external light source enters the liquid crystal 32 after passing through the color filter substrate 31 from the display side, and is reflected out of the display apparatus by the reflection layer 10, facing the color filter substrate 31, in the array substrate 33. Therefore, the display apparatus does not require a backlight source, and display can be realized under the condition of ambient light.

The display apparatus may be any product or component having a display function, such as a desktop computer, a tablet computer, a notebook computer, a mobile phone, a PDA, a GPS, a vehicle-mounted display, a projection display, a video camera, a digital camera, an electronic watch, a calculator, an electronic instrument, an instrument board, a liquid crystal panel, an electronic paper, a television, a monitor, a digital photo frame, a navigator, etc., and can be used in many fields such as public display and virtual display.

It should be understood that the above implementations are merely exemplary implementations for explaining the principle of the present disclosure, but the present disclosure is not limited thereto. For those skilled in the art, various variations and improvements may be made without departing from the spirit and essence of the present disclosure, and these variations and improvements shall also be regarded as falling into the protection scope of the present disclosure.

The invention claimed is:

1. An array substrate, comprising: a display area and a non-display area in the periphery of the display area, the non-display area being an area without liquid crystal, the display area comprising a plurality of pixel regions, both the display area and the non-display area being provided with via holes, wherein each of the plurality of pixel regions is provided with a reflection layer at a side facing a display side, and the reflection layer is configured to reflect light irradiated thereon from an external light source to form a display image; and the array substrate further comprises an anti-deterioration layer in direct contact with the reflection layer, wherein both of the anti-deterioration layer and the reflection layer are provided in the via holes in the display area, only the anti-deterioration layer of the anti-deterioration layer and the reflection layer is provided in the via holes in the non-display area, and the anti-deterioration layer is made of any one or any combination of molybdenum, niobium, and molybdenum titanium alloy.

2. The array substrate of claim 1, wherein in the display area, the anti-deterioration layer and the reflection layer have substantially the same pattern.

3. The array substrate of claim 1, wherein the reflection layer is made of any one or any combination of aluminum, silver, and aluminum neodymium alloy.

4. The array substrate of claim 1, wherein each of the plurality of pixel regions is provided with a substrate and a thin film transistor, the thin film transistor is on the substrate, and the anti-deterioration layer is on a side of the thin film transistor distal to the substrate, the reflection layer is on a side of the anti-deterioration layer distal to the thin film transistor, and the reflection layer and the anti-deterioration layer are coupled to a drain electrode of the thin film transistor.

5. The array substrate of claim 4, further comprising a transparent electrode layer coupled to the anti-deterioration layer and the reflection layer, wherein the transparent electrode layer is on a side of the anti-deterioration layer close to the thin film transistor.

6. The array substrate of claim 5, wherein the transparent electrode layer is further provided in the via holes of the display area and the non-display area.

7. A display apparatus, comprising the array substrate of claim 1.

8. A method for manufacturing an array substrate, wherein the array substrate comprises a display area and a non-display area in the periphery of the display area, the non-display area being an area without liquid crystal, the display area comprises a plurality of pixel regions, the display area and the non-display area are both provided with via holes, and the method comprises: forming a reflection layer at a side facing a display side in each of the plurality of pixel regions, the reflection layer being configured to reflect light irradiated thereon from an external light source to form a display image; and forming an anti-deterioration layer in direct contact with the reflection layer, wherein both of the anti-deterioration layer and the reflection layer are formed in the via holes in the display area, t only the anti-deterioration layer of the anti-deterioration layer and the reflection layer is formed in the via holes in the non-display area, and the anti-deterioration layer is made of any one of or any combination of molybdenum, niobium, and molybdenum titanium alloy.

9. The method of claim 8, wherein the anti-deterioration layer and the reflection layer are formed in one patterning process, and in the display area, the anti-deterioration layer and the reflection layer have substantially the same pattern.

10. The method of claim 9, wherein each of the plurality of pixel regions further comprises a substrate and a thin film transistor, and the method comprises:

forming the thin film transistor on the substrate, wherein the anti-deterioration layer is provided on a side of the thin film transistor distal to the substrate, the reflection layer is provided on a side of the anti-deterioration layer distal to the thin film transistor, and the reflection layer and the anti-deterioration layer are coupled to a drain electrode of the thin film transistor.

11. The method of claim 10, wherein forming the anti-deterioration layer and the reflection layer in one patterning process comprises: sequentially depositing an anti-deterioration material layer and a reflection material layer, and performing one patterning process on the anti-deterioration material layer and the reflection material layer using a half tone mask or a gray tone mask to form a pattern comprising the anti-deterioration layer and the reflection layer, wherein blocking areas of the half tone mask or the gray tone mask correspond to the pixel regions and the via holes in the display area, half-exposing areas of the half tone mask or the gray tone mask correspond to the via holes in the non-display area, and fully-exposing areas of the half tone mask or the gray tone mask correspond to other areas.

12. The method of claim 8, wherein each of the plurality of pixel regions further comprises a substrate, a thin film transistor and a transparent electrode layer, and the method comprises:

forming the thin film transistor on the substrate; and forming the transparent electrode layer, the anti-deterioration layer and the reflection layer on a side of the thin film transistor distal to the substrate in one patterning process, wherein the transparent electrode layer is provided on a side of the thin film transistor distal to the substrate, the anti-deterioration layer is provided on a side of the transparent electrode layer distal to the thin film transistor, the reflection layer is provided on a side of the anti-deterioration layer distal to the transparent electrode layer, and the transparent electrode layer, the reflection layer and the anti-deterioration layer are coupled to a drain electrode of the thin film transistor.

13. The method of claim 12, wherein forming the transparent electrode layer, the anti-deterioration layer and the reflection layer in one patterning process comprises: sequentially depositing a transparent electrode material layer, an anti-deterioration material layer, and a reflection material layer, and performing one patterning process on the transparent electrode material layer, the anti-deterioration material layer and the reflection material layer using a half tone mask or a gray tone mask to form a pattern comprising the transparent electrode layer, the anti-deterioration layer and the reflection layer, wherein blocking areas of the half tone mask or the gray tone mask correspond to the pixel regions and the via holes in the display area, half-exposing areas of the half tone mask or the gray tone mask correspond to the via holes in the non-display area, and fully-exposing areas of the half tone mask or the gray tone mask correspond to other areas.

\* \* \* \* \*